(12) United States Patent
An et al.

(10) Patent No.: US 12,000,863 B2
(45) Date of Patent: Jun. 4, 2024

(54) PROBE PIN HAVING GRIPPING STRUCTURE

(71) Applicant: TSE CO., LTD., Chungcheongnam-do (KR)

(72) Inventors: Seung Bae An, Chungcheongnam-do (KR); Byeong Soo Park, Chungcheongnam-do (KR)

(73) Assignee: TSE CO., LTD., Chungcheongnam-do (KR)

( * ) Notice: Subject to any disclaimer, the term of this patent is extended or adjusted under 35 U.S.C. 154(b) by 77 days.

(21) Appl. No.: 17/927,772

(22) PCT Filed: May 29, 2020

(86) PCT No.: PCT/KR2020/006960
§ 371 (c)(1),
(2) Date: Nov. 25, 2022

(87) PCT Pub. No.: WO2021/241784
PCT Pub. Date: Dec. 2, 2021

(65) Prior Publication Data
US 2023/0266361 A1   Aug. 24, 2023

(51) Int. Cl.
*G01R 1/067* (2006.01)

(52) U.S. Cl.
CPC ..... *G01R 1/06716* (2013.01); *G01R 1/06738* (2013.01); *G01R 1/06755* (2013.01)

(58) Field of Classification Search
CPC ............ G01R 1/06716; G01R 1/06738; G01R 1/06755
See application file for complete search history.

(56) References Cited

U.S. PATENT DOCUMENTS 9,146,257 B2   9/2015   Uebayashi et al.
11,061,052 B2   7/2021   Lee et al.
(Continued)

FOREIGN PATENT DOCUMENTS

JP   2017053660 A  *  3/2017
KR   10-2007-0113782 A   11/2007
(Continued)

OTHER PUBLICATIONS

Machine translation of cited Foreign reference JP-2017-053660-A (Year: 2017).*
(Continued)

*Primary Examiner* — G. M. A Hyder
(74) *Attorney, Agent, or Firm* — Crowell & Moring LLP; John C. Freeman

(57) ABSTRACT

A probe pin having an improved gripping structure is disclosed. The disclosed probe pin includes a pin body including a plurality of holes and positioned at one side, a first extension portion extending upward from an outer side of the pin body, a second extension portion elongated from the other end of the first extension portion, further extending than the pin body in the other direction, and spaced apart from the pin body, and a tip part integrated with the second extension portion and having an end sharply protruding upward from an outer upper end of the second extension portion, in which the second extension portion includes a plurality of elasticity provision holes formed in parallel with an outer peripheral surface of the second extension portion and having different shapes to provide an elastic force that moves a portion of a needle of the tip part.

4 Claims, 4 Drawing Sheets

(56) References Cited

U.S. PATENT DOCUMENTS

| | | |
|---|---|---|
| 2011/0291685 A1 | 12/2011 | Mori |
| 2014/0043055 A1 | 2/2014 | Uebayashi et al. |
| 2020/0081035 A1 | 3/2020 | Lee et al. |

FOREIGN PATENT DOCUMENTS

| | | |
|---|---|---|
| KR | 10-2010-0055911 A | 5/2010 |
| KR | 10-2011-0111398 A | 10/2011 |
| KR | 10-2014-0021478 A | 2/2014 |
| KR | 10-2020-0029766 A | 3/2020 |

OTHER PUBLICATIONS

International Search Report dated Feb. 25, 2021 (four pages) out of PCT priority Application No. PCT/KR2020/006960.
Written Opinion dated Feb. 25, 2021 (four pages in foreign text) out of PCT priority Application No. PCT/KR2020/006960.

\* cited by examiner

US 12,000,863 B2

PROBE PIN HAVING GRIPPING STRUCTURE

This application is a national filing of Patent Cooperation Treaty Patent Application No. PCT/KR2020/006960, filed on May 29, 2020, the entire contents of which is incorporated herein by reference.

TECHNICAL FIELD

The present disclosure relates to a probe pin having an improved gripping structure.

More specifically, the present disclosure relates to a probe pin having an improved gripping structure, which is capable of being mass-produced and maintaining precision thereof.

BACKGROUND ART

A probe card refers to an interface part that connects a test object and a tester that generates a test signal and reads out a test result during an electrical property test (electrical die sorting (EDS)) for testing electrical properties of various test objects including semiconductors.

A probe pin of the probe card comes into direct contact with a pad (e.g., an external signal connection terminal) of a test object such as a semiconductor, transmits a signal from the tester, and receives a signal corresponding to the signal from the tester. As an integrated state of the semiconductor increases, the number of pads to be subjected to the test increases, and intervals between the pads greatly decrease, such that the probe pins may be formed to be very thin and disposed densely. The types of probe pins, which have been developed up to now, include a needle-type probe pin manufactured by using a tungsten or rhenium tungsten wire as a material, a blade-type probe pin manufactured by using nickel or beryllium as a material, a film-type probe pin manufactured by placing a copper plate or other conductors on a polymide film and then performing etching processing, a hybrid-type probe pin manufactured by doping the film-type probe pin with a conductive medium by using a semiconductor process technology, a pogo-type probe pin manufactured by using a pogo pin as a material using spring tension, and an MEMS-type probe pin manufactured by using a semiconductor MEMS process technology.

In the case of a general probe pin, because an elastic part, which connects a tip and a base, is constituted as a single component, there is a problem in that an elastic force cannot be uniformly generated when the test object and the tip come into contact with each other. For this reason, there is a problem in that the tip damages the test object.

A length of a probe pin in the related art may be designed based on a Y size of a wafer chip. Meanwhile, as the technology has been developed and the semiconductor has been integrated recently, the Y size of the wafer chip is shortened from 6 mm to 5 mm, and it is necessary to cope with a tacnode that is shortened to 3.5 mm or less.

However, a length of the probe is restricted to 1.5 mm or less to cope with the Y size of the wafer chip that is 3.5 mm or less, and a length of a gripper needs to be reduced to 200 μm to cope with the Y size of the wafer chip in consideration of the restriction. However, the gripper becomes excessively small as the length decreases, which degrades durability.

At present, an optimal length of the gripper, which enables the gripper to hold the probe, is required to be 300 μm or more. Therefore, the length of the gripper part needs to be maintained to be 300 μm or more, and the length of the probe needs to be restricted to 1.5 mm or less.

Disclosure of Invention

Technical Problem

The present disclosure has been made in an effort to solve the above-mentioned problems in the related art, and an object of the present disclosure is to provide a probe pin implemented such that first and second extension portions of a probe are positioned between a probe gripping part and a pin body of the probe pin, and the gripping part is positioned on an upper portion of a bonding base to prevent a position of the probe pin from being distorted during a process of mounting the probe pin on a substrate.

In addition, another object of the present disclosure is to provide a probe pin implemented to grip a probe even though a wafer chip has a Y size of 3.5 mm or less, such that the probe pin may be improved to be mass-produced and maintain bonding and precision thereof.

Solution to Problem

To achieve the above-mentioned object, a probe pin according to one aspect of the present disclosure includes: a pin body including a plurality of holes and positioned at one side; a first extension portion extending upward from an outer side of the pin body; a second extension portion elongated from the other end of the first extension portion, further extending than the pin body in the other direction, and spaced apart from the pin body; and a tip part integrated with the second extension portion and having an end sharply protruding upward from an outer upper end of the second extension portion, in which the second extension portion includes a plurality of elasticity provision holes formed in parallel with an outer peripheral surface of the second extension portion and having different shapes to provide an elastic force that moves a portion of a needle of the tip part.

The first elasticity provision hole may have a thin elongated shape, the second elasticity provision hole may be thicker than the first elasticity provision hole and formed above the first elasticity provision hole, and the second elasticity provision hole may be divided by a protruding portion formed on a front surface of the first extension portion.

The probe pin may further include a gripping part formed on an upper portion of the first extension portion so as to be gripped by a gripper.

The gripping part may be formed on the upper portion of the first extension portion and the second extension portion may be provided at a lower portion of the gripping part so that the gripper grips the gripping part at an inner side of the pin body on which a bonding process is performed.

The pin body may protrude toward the second extension portion and maintain rigidity.

Advantageous Effects of Invention

The probe pin having the improved gripping structure according to the embodiment of the present disclosure provides the following effects through the above-mentioned solutions.

The second extension portion is formed at the position below the gripping part, and one end of the second extension portion, which is formed below the elasticity provision hole, is connected to the upper portion of the pin body, which makes it possible to maintain higher rigidity in comparison with the probe pin in the related art.

In addition, the gripper may grip the gripping part formed on the upper portion of the first extension portion at an inner side of the pin body on which the bonding process is performed, which makes it possible to prevent the tip part from being lifted based on the pin body during the bonding process and to maintain the bonding and precision.

Additional advantages of the present disclosure may be clearly understood from the following description with reference to the accompanying drawings in which the same or similar constituent elements will be designated by the same reference numerals.

MODE FOR THE INVENTION

Figure 1:
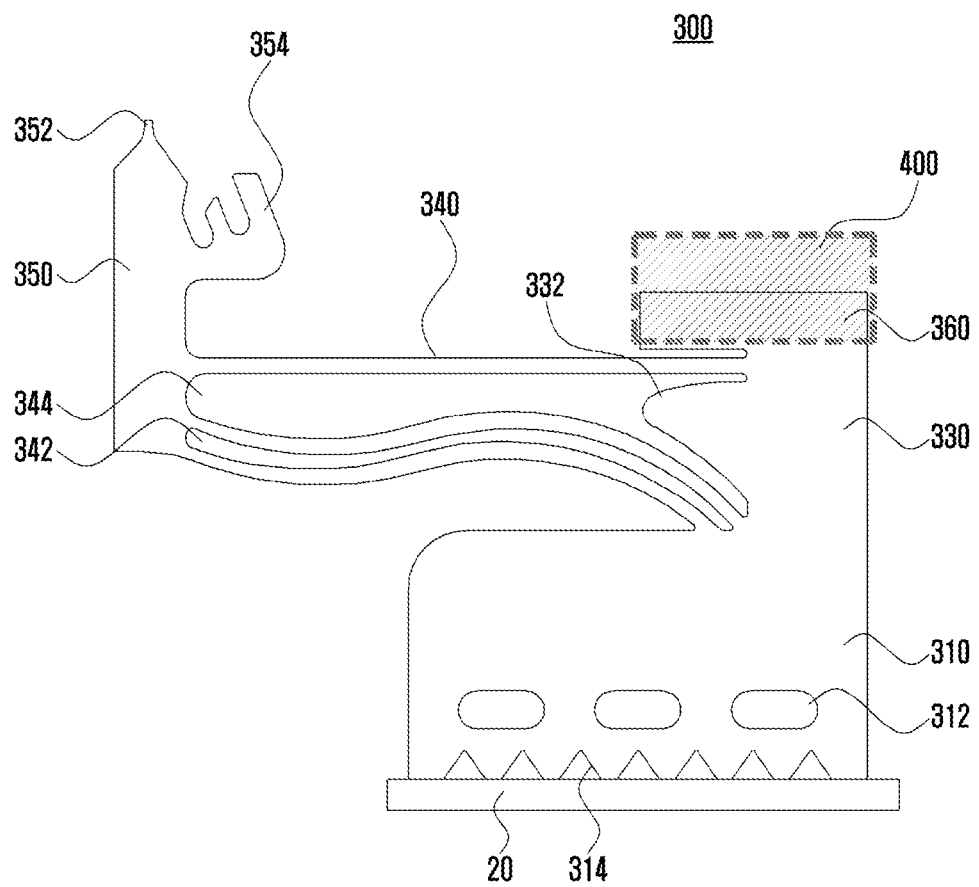
FIG. 1 is a schematic view illustrating a probe pin having an improved gripping structure according to an embodiment of the present disclosure.

Hereinafter, constitutions and operations according to the embodiment of the present disclosure will be described in detail with reference to the accompanying drawings. The following description is one of the various aspects of the present disclosure that can be claimed, and the following description may constitute a part of the detailed technology for the present disclosure.

However, in the description of the present disclosure, the specific description of publicly-known constitutions or functions may be omitted to clarify the present disclosure.

The present disclosure may be variously modified and include various embodiments, and particular embodiments illustrated in the drawings will be described in detail. However, the description of the exemplary embodiments is not intended to limit the present disclosure to the particular exemplary embodiments, but it should be understood that the present disclosure is to cover all modifications, equivalents and alternatives falling within the spirit and technical scope of the present disclosure.

The terms including ordinal numbers such as "first," "second," and the like may be used to describe various constituent elements, but the constituent elements are not limited by the terms. These terms are used only to distinguish one constituent element from another constituent element.

The terminology used herein is used for the purpose of describing particular embodiments only and is not intended to limit the present disclosure. Singular expressions include plural expressions unless clearly described as different meanings in the context.

Hereinafter, an embodiment of the present disclosure will be described in detail with reference to the accompanying drawings.

Figure 2A:
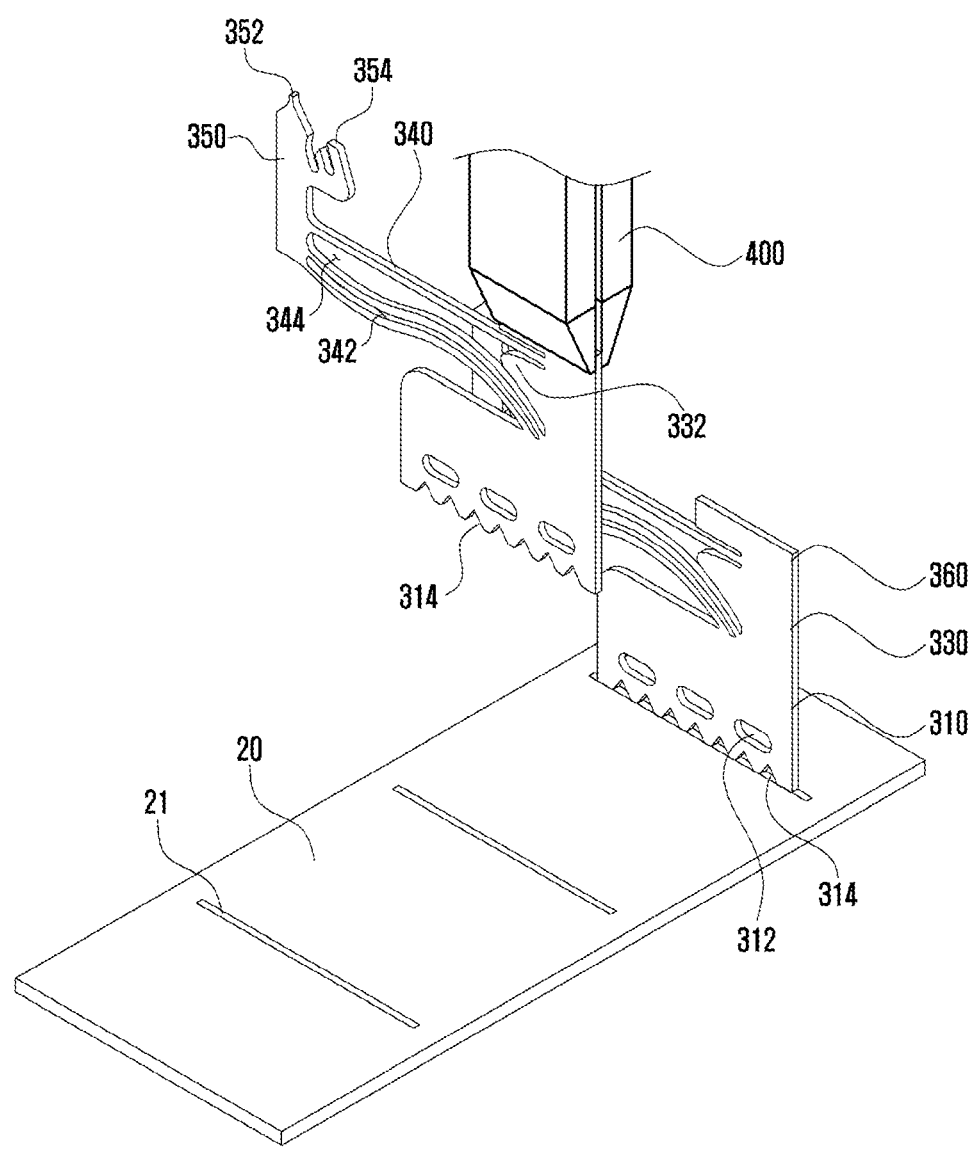
FIGS. 2A to 2C are views illustrating operational sequences of a process of soldering the probe pin illustrated in FIG. 1.
Figure 2B:
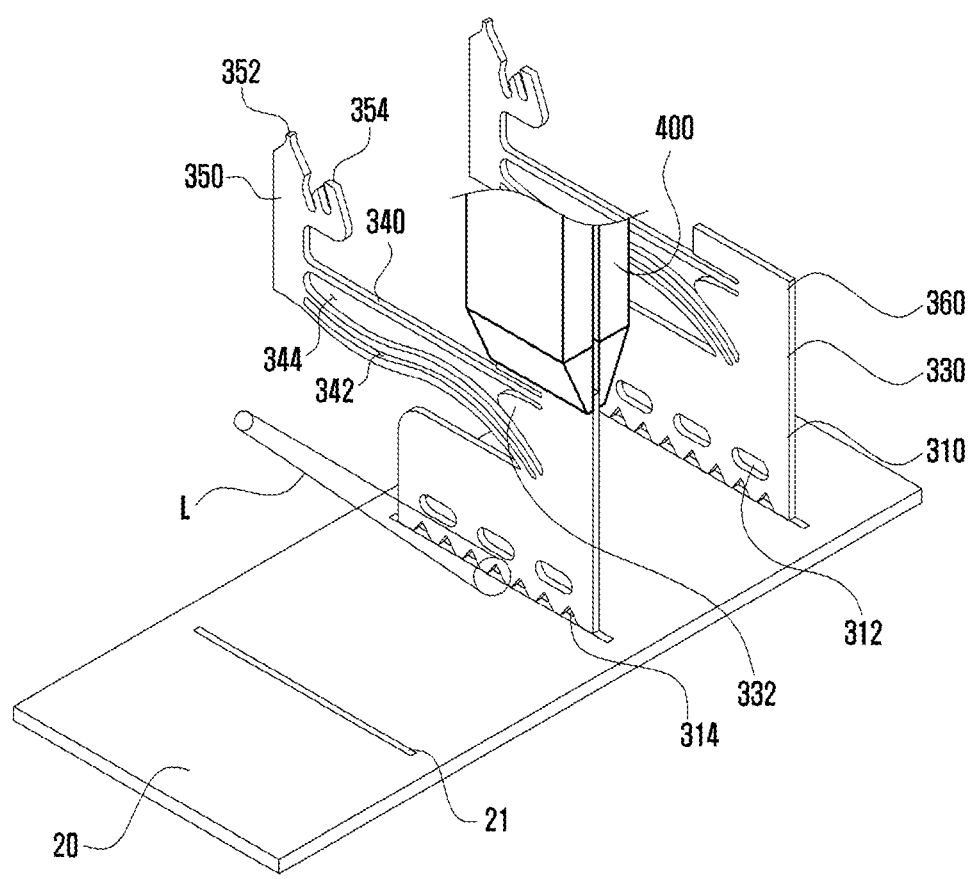
Figure 2C:
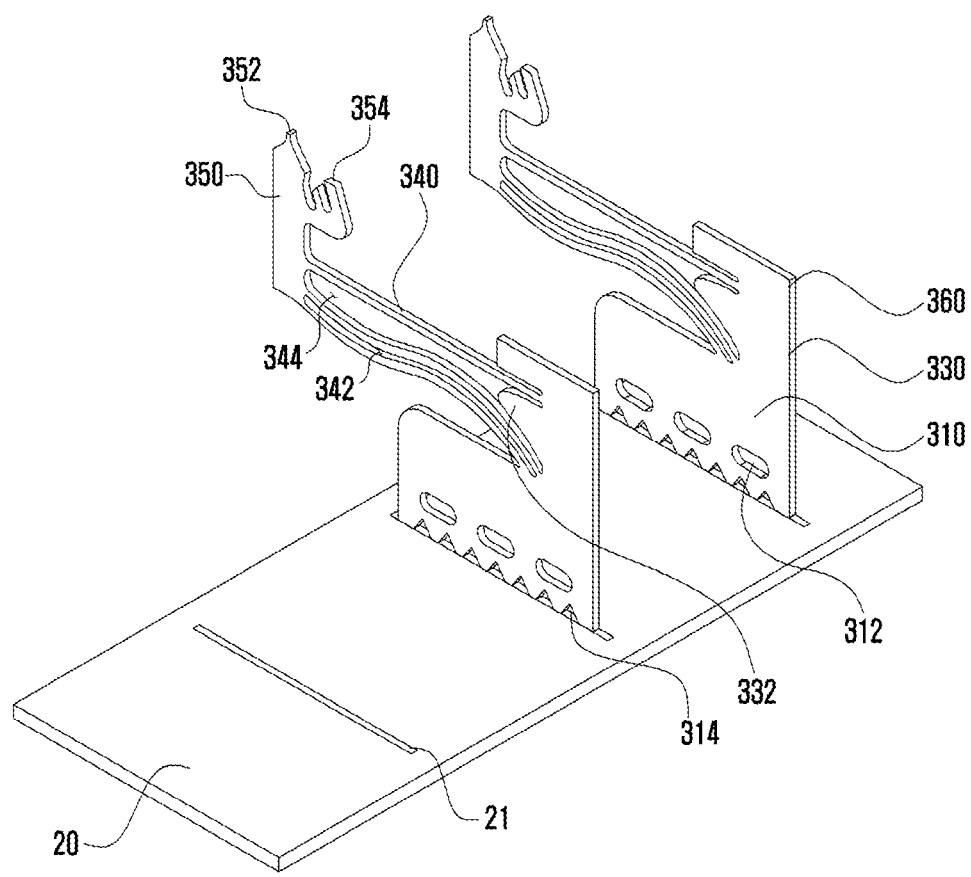

FIG. 1 is a schematic view illustrating a probe pin having an improved gripping structure according to an embodiment of the present disclosure, and FIGS. 2A to 2C are views illustrating operational sequences of a process of soldering the probe pin illustrated in FIG. 1.

With reference to FIG. 1, a probe pin 300 according to an exemplary embodiment of the present disclosure includes: a pin body 310 including a plurality of holes 312 and positioned at one side; a first extension portion 330 extending upward from an outer side of the pin body 310; a second extension portion 340 elongated from the other end of the first extension portion 330, further extending than the pin body 310 in the other direction, and spaced apart from the pin body 310; and a tip part 350 integrated with the second extension portion 340 and having an end sharply protruding upward from an outer upper end of the second extension portion 340.

Because the pin body 310 includes the plurality of holes 312, a joining agent is positioned at two opposite sides of the pin body 310 through the holes 312 when the probe pin 300 is joined directly to a main substrate (not illustrated), which may improve bondability.

In addition, a lower end of the pin body 310, i.e., a lower end 314 joined to the main substrate may be formed in a serrated shape. Therefore, the serrated shape increases a joining area when the probe pin 300 is joined directly to the main substrate in comparison with a linear shape, which may improve bondability.

The tip part 350 may include: a needle 352 tapered to be formed sharply and constituted to come into contact with lead wires of a panel when the panel is tested; and an alignment portion 354 extending to be spaced apart from the needle 352. In this case, the needle 352 further protrudes from the second extension portion 340 than the alignment portion 354. Further, the alignment portion 354 is used to determine whether the alignment is implemented when the needle 252 comes into contact with each of the lead wires of the panel.

The second extension portion 340 includes a plurality of elasticity provision holes 342 and 344 formed in a rod shape in a central portion. The elasticity provision holes 342 and 344, which are illustrated in the drawings in which two elasticity provision holes are illustrated, are elongated in a longitudinal direction of the second extension portion 340 and formed in parallel with an outer peripheral surface of the second extension portion 340. One or more elasticity provision holes may be provided. In addition, the elasticity provision hole may have other shapes.

The first elasticity provision hole 342 has a thin elongated shape. However, the second elasticity provision hole 344 is thicker than the first elasticity provision hole 342 and formed above the first elasticity provision hole 342. The second elasticity provision hole 344 may be divided by a protruding portion 332 formed on a front surface of the first extension portion 330 and provide various elasticities. According to the embodiment, although not specifically illustrated, the protruding portion 332 may have a plurality of separated protruding portions or various shapes, thereby providing various elasticities. Furthermore, to solve a problem of heat generation caused by applied current, a structure, such as a protruding portion, capable of increasing a surface area of the pin may be disposed to facilitate heat dissipation.

As described above, the probe pin 300 according to the embodiment of the present disclosure includes the elasticity provision holes 342 and 344 structured as described above, and the portion of the needle 352 includes the elasticity provision holes 342 and 344 disposed at upper and lower sides thereof, thereby providing an elastic force that may move the portion of the needle 352 upward or downward.

Meanwhile, the second extension portion 340 may be formed at a position below a gripping part 360 to be described below. One end of the second extension portion 340, which is formed below the elasticity provision holes 342 and 344, may be connected to an upper portion of the pin body 310. Therefore, the probe pin may maintain higher rigidity in comparison with the probe pin in the related art.

In addition, the probe pin 300 according to the embodiment of the present disclosure may further include the gripping part 360 formed on an upper portion of the first extension portion 330 so as to be gripped by the gripper 400.

The gripping part 360 may be formed in an inner region that does not depart from one end (a right end in FIG. 1) of the first extension portion 330.

Particularly, one end of the first extension portion 330 may coincide with one end of the pin body 310, and one end of the first extension portion 330 may coincide with one end of the gripping part 360.

Meanwhile, a longitudinal width of the gripping part 360 may be equal to or smaller than a longitudinal width of the gripper 400. Particularly, a longitudinal width of the gripping part 360 may be equal to a longitudinal width of the gripper 400.

As described above, one end of the pin body 310, one end of the first extension portion 330, and one end of the gripping part 360 are coincident with one another, and the longitudinal width of the gripping part 360 is equal to the longitudinal width of the gripper 400. Therefore, a direction of a load transmitted from the gripper 400 may be coincident with a vertical direction in case that the gripper 400 holds the gripping part 360 and comes into contact with the substrate 20 for the bonding process. Therefore, during the bonding process, the other end portion of the pin body 310 (a left end of the pin body 310 in FIG. 1) may be prevented from being lifted up. As a result, the tip part 350 may be prevented from being lifted up.

Meanwhile, because the pin body 310 protrudes toward the tip part 350 from the first extension portion 330 and the gripping part 360, the other end portion of the pin body 310 may be further prevented from being lifted up during the bonding process.

The probe pin 300 according to the present disclosure constituted as described above may be bonded by an operation of a bonding device. Hereinafter, a bonding method using the operation of the bonding device will be described.

First, in a state in which a plurality of probe pins 300 is mounted on a cassette, the cassette moves and approaches the gripper 400 in a predetermined direction, a position of the probe pin 300 is mapped by a vision system (not illustrated), such that an accurate position is recognized. Thereafter, the gripper 400 grips the gripping part 360 and transfer the gripping part 360 sequentially.

A soldering process is required to electrically connect and couple the transferred probe pin 300 to the substrate 20, and a material such as lead may be required for the soldering. The gripper 400 holds the gripping part 360 of the probe pin 300 and then dips the pin body 310 into lead in a lead tub, such that the lead is applied onto a surface of the pin body 310. Thereafter, as illustrated in FIGS. 2A to 2C, the gripper 400 may transfer the probe pin 300 to the substrate 20. Alternatively, the probe pin 300 having the pin body 310, which is plated with lead in advance, may be transferred to the substrate 20 by the gripper 400 as illustrated in FIGS. 2A to 2C.

In this state, the vision system is used to rotate and align a stage (not illustrated) in an X direction, a Y direction, and a Z direction. The position of the pin body 310 of the probe pin 300 according to the embodiment of the present disclosure and the position of an electrode 21 of the substrate 20 are identified and aligned, and then a lower portion of the pin body 310 of the probe pin 300 or the substrate 20 is irradiated with laser beams L, such that the lower portion of the pin body 310 is soldered to the electrode 21 of the substrate 20. Of course, the soldering process is monitored by a monitoring means (not illustrated).

According to the probe pin according to the present disclosure as described above, the second extension portion is formed at the position below the gripping part, and one end of the second extension portion, which is formed below the elasticity provision hole, is connected to the upper portion of the pin body, which makes it possible to maintain higher rigidity in comparison with the probe pin in the related art.

In addition, the gripper may grip the gripping part formed on the upper portion of the first extension portion at an inner side of the pin body on which the bonding process is performed, which makes it possible to prevent the tip part from being lifted based on the pin body during the bonding process and to maintain the bonding and precision.

INDUSTRIAL APPLICABILITY

Various modified examples may be disclosed in the present specification and made as exemplified constitutions and methods without departing from the scope of the present disclosure. Therefore, all matters included in the detailed description or illustrated in the accompanying drawings are exemplary but are not intended to limit the present disclosure. Accordingly, the scope of the present disclosure is not limited by the above-mentioned exemplary embodiment and needs to be determined only by the appended claims and the equivalents thereof.

The invention claimed is:

1. A probe pin comprising:
   a pin body including a plurality of holes and positioned at one side;
   a first extension portion extending in a first direction upward from an outer side of the pin body;
   a second extension portion elongated from an end of the first extension portion, extending further than the pin body along a second direction, and spaced apart from the pin body; and
   a tip part integrated with the second extension portion and comprising an end sharply protruding upward along the first direction from an outer upper end of the second extension portion,
   wherein the second extension portion includes a first elasticity provision hole and a second elasticity provision hole formed in parallel with an outer peripheral surface of the second extension portion and having different shapes to provide an elastic force that moves a portion of a needle of the tip part,
   wherein the first elasticity provision hole has a thin elongated shape,
   wherein the second elasticity provision hole is thicker than the first elasticity provision hole and formed above the first elasticity provision hole,
   wherein the second elasticity provision hole is divided by a protruding portion formed on a front surface of the first extension portion,
   wherein the tip part further comprises an alignment portion extending to be spaced apart from the needle, and
   wherein the needle protrudes further from the second extension portion than the alignment portion.

2. The probe pin of claim 1, further comprising:
   a gripping part formed on an upper portion of the first extension portion so as to be gripped by a gripper.

3. The probe pin of claim 2, wherein the gripping part is formed on the upper portion of the first extension portion and the second extension portion is provided at a lower portion of the gripping part so that the gripper grips the gripping part at an inner side of the pin body on which a bonding process is performed.

4. The probe pin of claim 1, wherein the pin body protrudes toward the second extension portion and maintains rigidity.

* * * * *